US 12,140,857 B2

United States Patent
Chen et al.

(10) Patent No.: US 12,140,857 B2
(45) Date of Patent: *Nov. 12, 2024

(54) METHOD OF FAST SURFACE PARTICLE AND SCRATCH DETECTION FOR EUV MASK BACKSIDE

(71) Applicant: TAIWAN SEMICONDUCTOR MANUFACTURING COMPANY, LTD., Hsinchu (TW)

(72) Inventors: Chih-Cheng Chen, Hsinchu (TW); ShinAn Ku, Hsinchu (TW); Ting-Hao Hsu, Hsinchu (TW); Hsin-Chang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/225,404

(22) Filed: Jul. 24, 2023

(65) Prior Publication Data

US 2023/0367192 A1 Nov. 16, 2023

Related U.S. Application Data

(63) Continuation of application No. 17/094,727, filed on Nov. 10, 2020, now Pat. No. 11,768,431.

(60) Provisional application No. 62/955,846, filed on Dec. 31, 2019.

(51) Int. Cl.
| | |
|---|---|
| *G03F 1/22* | (2012.01) |
| *G01B 11/22* | (2006.01) |
| *G01B 11/24* | (2006.01) |
| *G01J 3/02* | (2006.01) |

(52) U.S. Cl.
CPC ................. *G03F 1/22* (2013.01); *G01B 11/22* (2013.01); *G01B 11/24* (2013.01); *G01J 3/0208* (2013.01)

(58) Field of Classification Search
CPC . G03F 1/22; G01B 11/22; G01B 11/24; G01J 3/0208
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |

(Continued)

OTHER PUBLICATIONS

Micro-Epsilon Messtechnik. "Confocal chromatic sensors." Online video clip. YouTube. YouTube, Oct. 9, 2015, https://www.youtube.com/watch?v=8091SXIC4_0.

(Continued)

*Primary Examiner* — Jamil Ahmed
(74) *Attorney, Agent, or Firm* — STUDEBAKER & BRACKETT PC

(57) ABSTRACT

A method of scanning a substrate and determining scratches of the substrate includes transmitting a converging beam of light that comprises multiple wavelengths to the substrate. Each wavelength of the multiple wavelengths focuses at a different distance in a focus interval around and including a surface of the substrate. The method also includes receiving reflected light from the surface of the substrate and determining a height or depth of the surface of the substrate based on a wavelength of the reflected light a highest intensity.

20 Claims, 13 Drawing Sheets

(56) References Cited

U.S. PATENT DOCUMENTS

| | | |
|---|---|---|
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2008/0018883 A1 | 1/2008 | Kvamme et al. |
| 2011/0181868 A1 | 7/2011 | Stokowski |
| 2012/0243770 A1 | 9/2012 | Kaneko et al. |
| 2013/0063721 A1 | 3/2013 | Fujii et al. |
| 2014/0300890 A1* | 10/2014 | Lange ................ G01N 21/9501 |
| | | 356/51 |

OTHER PUBLICATIONS

Non-Final Office Action issued in U.S. Appl. No. 17/094,727, dated Nov. 5, 2021.
Final Office Action issued in U.S. Appl. No. 17/094,727, dated Feb. 23, 2022.
Non-Final Office Action issued in U.S. Appl. No. 17/094,727, dated Jun. 13, 2022.
Final Office Action issued in U.S. Appl. No. 17/094,727, dated Sep. 22, 2022.
Non-Final Office Action issued in U.S. Appl. No. 17/094,727, dated Jan. 25, 2023.
Notice of Allowance issued in U.S. Appl. No. 17/094,727, dated May 15, 2023.

\* cited by examiner

METHOD OF FAST SURFACE PARTICLE AND SCRATCH DETECTION FOR EUV MASK BACKSIDE

PRIORITY CLAIM AND CROSS-REFERENCE

This application is a continuation of U.S. patent application Ser. No. 17/094,727 filed on Nov. 10, 2020, which claims priority to U.S. Provisional Application No. 62/955,846 filed on Dec. 31, 2019, entitled "Method of Fast Surface Particle and Scratch Detection for EUV Mask Backside," the entire disclosure of which is incorporated herein by reference.

BACKGROUND

During an integrated circuit (IC) design, a number of layout patterns of the IC, for different steps of IC processing, are generated. The layout patterns include geometric shapes corresponding to structures to be fabricated on a wafer. The layout patterns may be produced by projecting, e.g., imaging, a mask on the wafer. The mask includes a layout pattern that is produced on a clean (with no pattern) semiconductor substrate or a mask blank. Thus, the masks include a layout pattern of the IC or a layout pattern of a portion of the IC that is created on the mask blank. A lithography process transfers a layout pattern of the mask to the wafer such that etching, implantation, or other steps are applied only to predefined regions of the wafer.

In some embodiments, a reflective mask is used during extreme ultraviolet (EUV) lithography process to form an integrated circuit having smaller feature sizes. Reflective masks are vulnerable to manufacturing/fabrication defects, such as oxidation and particles, and are easily damaged. Therefore, a number of defects may exist on the mask surface that can affect the layout printing that are produced by patterned masks. In addition, the printing error of the layout pattern of the mask may impact the fabricated circuit on the wafer. An efficient mask blank scanning (e.g., mapping) is desirable to detect the defect of the mask blank to avoid the impact of the defects when producing the mask on the mask blank.

In some embodiments, a scratch is on the backside including the backside edge of the mask and the scratch causes defects such as dips or bumps on the front side of the mask or causes a defect, e.g., anomaly, in the thickness of the mask that is desirable to be avoided. Therefore, the backside including the backside edges of the mask blank is scanned (e.g., mapped) for the scratches to determine areas of the mask including edge zones of the mask that is desirable to be avoided when the mask is created on the mask blank.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
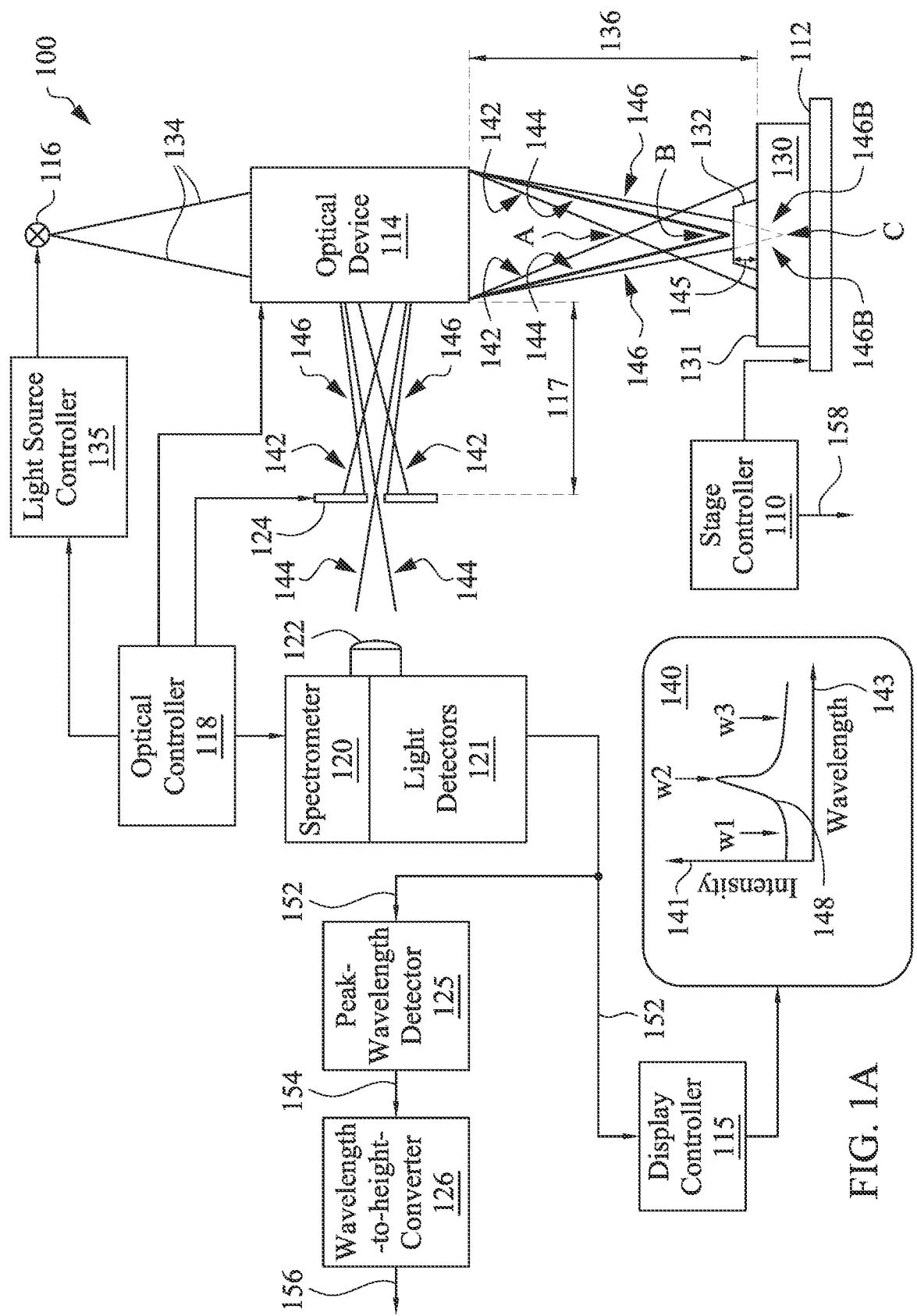
FIGS. 1A and 1B illustrate optical scanning systems for scanning a substrate in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, a substrate, e.g., a mask blank, is scanned for bumps and dips. When producing a mask and imaging a layout pattern on the mask blank, the bumps and dips are avoided for wafer printing error concerns. In some embodiments, a scratch on the backside of the mask blank causes dips and/or bumps on the front side of the mask blank where the layout pattern is created. In some embodiments, the scratch on the backside of the mask blank causes some changes in the thickness of the mask blank that although may not be visible on the front side of the mask blank, may degrade the wafer layout pattern that is produced by the mask. Therefore, the backside of the mask blank is examined for scratches and particles, e.g., bump and/or dips, and the areas of the mask blank to be avoided, cleaned, or repaired is mapped. A fast scanning method for inspecting the backside of the mask blank is desirable. In some embodiments, an edge region of the mask blank are more vulnerable for having scratches or particles and thus the edge region of the mask blank is inspected. In some embodiments, the entire backside of the mask blank is inspected.

In some embodiments, an optical system is used for scanning the backside of the mask blank. The optical system has a multi-wavelength light source, e.g., a white light source, and a chromatic lens. The chromatic lens that may include a plurality of lenses, stacked together in series, creates a focal distance for each wavelength of the light source. Thus, when a collimated beam of light is transmitted to the chromatic lens, each component of the collimated beam of light having a different wavelength is focused at a different focal point from the chromatic lens. In some embodiments, a component of the collimated beam of light having a shorter wavelength has a shorter focal point and focuses closer to the chromatic lens than a component of the collimated beam of light having a longer wavelength. Thus, for a collimated beam of white light, the violet component of the white light focuses closer to the chromatic lens than the green component and the green component focuses closer to the chromatic lens than the red component of the white light.

In some embodiments, the collimated beam of light is focused on a substrate. In some embodiments, the substrate has roughness with bumps and dips. Thus, when the collimated beam of white light is focused on the substrate, depending on the height of a bump or depth of a dip, a different color of the components of the white light is focused to a point on the substrate and the other components are not focused and create a blurred and expanded points, e.g., spot, on the substrate. In some embodiments, the reflected light from the substrate goes back through the chromatic lens and then is deflected by a mirror, e.g., a beam splitter, and the reflected and then deflected light is imaged to a pinhole in a plane. The component of the multi-wavelength light that is in-focus on the substrate is thus imaged as a point on the pinhole and passes, e.g., essentially entirely passes, through the pinhole and the other components of the white light that are not in-focus on the substrate are imaged as blurred and expanded points, e.g., spots, on the pinhole and, thus, only a fraction of the other components of the white light passes through the pinhole.

In some embodiments, the components of the white light or any multi-wavelength light source, after passing through the pinhole pass through a focusing lens of a spectrometer and then are detected per wavelength by the detectors of the spectrometer. In some embodiments, the spectrometer creates an output signal that is an intensity of the reflected light that passes through the pinhole as a function of the wavelength of the light. As noted, the component of the light that focuses on the substrate also focuses on the pinhole. Thus, if the output signal of the spectrometer passes through a peak detector, a wavelength of the light having the peak intensity, e.g., having the highest intensity, is determined. The wavelength of the light having the peak intensity is the wavelength of the light that is in-focus on the substrate. As described, each component of the light source that has a different wavelength focuses at a different distance from the chromatic lens. Thus, the wavelength that focuses on the substrate may determine the height or depth of the surface of the substrate. Therefore, the wavelength corresponding to the peak intensity of the output signal of the spectrometer determines the height of the surface of the substrate in some embodiments.

Figure 1B:
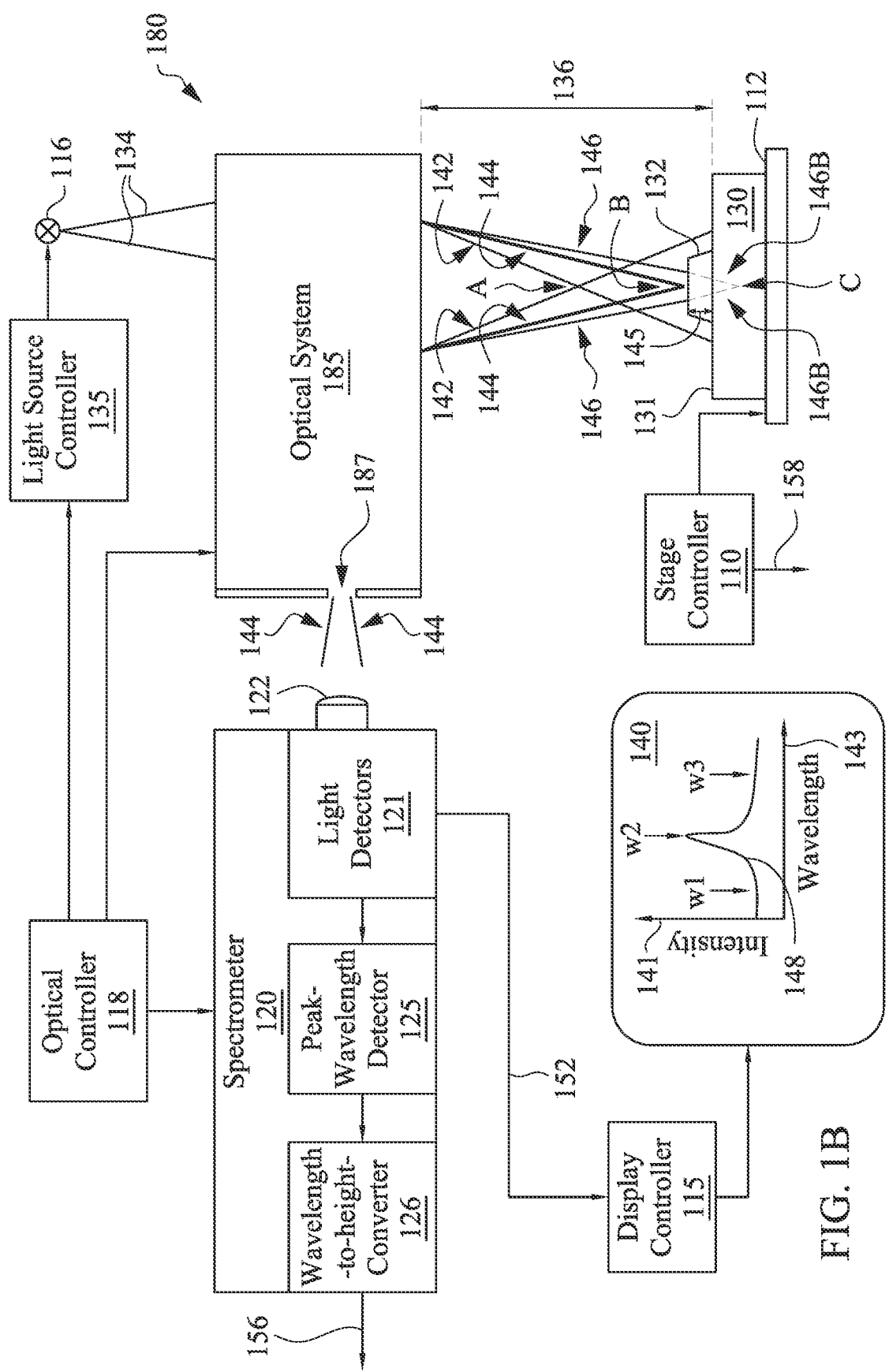

FIGS. 1A and 1B illustrate optical scanning systems 100 and 180 for scanning a substrate in accordance with some embodiments of the present disclosure. The optical scanning system 100 of FIG. 1A includes a light source 116 and a light source controller 135 for controlling the light source 116. The light source controller 135 commands the light source 116 to transmit a beam of light 134 that includes multiple wavelengths to an optical device 114. The optical device 114 that is controlled by an optical controller 118 receives the beam of light 134 and in response transmits beams of light 142, 144, and 146 to a surface 131 of a substrate 130. In some embodiments, the substrate 130 is a mask blank for EUV lithography. In other embodiments, the substrate 130 is a mask blank for DUV lithography, a glass substrate, or a semiconductor substrate. As shown in FIG. 1A, the beams of light 142, 144, and 146 focuses, e.g., converges, at different distances from the surface 131 of the substrate 130 such that the beam of light 142 focuses, e.g., converges, at point A before the surface 131 of the substrate 130 (i.e., the converging point is between the optical device 114 and the surface 131). The beam of light 144 focuses, e.g., converges, at point B before the surface 131 of the substrate 130 and the beam of light 146 is converging to point C after, e.g., under, the surface 131 of the substrate 130 (i.e., focus point is in the substrate 130). In some embodiments, when there is a bump 132 on the surface of the substrate 130, the beam of light 144 focuses at the point A that is on the bump 132 and thus the beam of light 144 converges as the point A on the bump 132. The beam of light 142 that converges at the point A, generates a spot on the surface 131 of the substrate 130 that covers the bump 132 and portions of the surface 131 of the substrate 130 in some embodiments. The beam of light 146 that would be converging to point C after the surface 131 of the substrate 130 also generates a spot on the bump 132. As noted, the beam of light 146 is stopped by a top surface of the bump 132 and, thus, the extensions of the beam of light 146 inside the bump 132 and inside the substrate 130 is shown by broken lines 146B. In some embodiments, the optical controller 118 controls the light source 116 and commands the light source 116, via the light source controller 135, to transmit the beam of light 134.

In some embodiments, the substrate 130 is a mask blank that is placed on a stage 112 and the stage 112 is moved by a stage controller 110 such that the beam of light 134 is transmitted to multiple locations on the surface of the substrate 130 and a line on the surface 131 of the substrate 130 or an area of the surface 131 of the substrate 130 is scanned, e.g., mapped. In some embodiments, the optical device 114 receives the reflected light from the surface of the substrate 130 and transmits, e.g., images, the reflected light from the surface 131 of the substrate 130 to a pinhole structure 124 that includes a pinhole 149. In some embodiments, a position and a size of the pinhole 149 is controlled by the optical controller 118 such that a beam from the beams of light 142, 144, and 146 that is in-focus on the surface of the substrate 130 is also in-focus on the pinhole and substantially entirely, e.g., more than 90 percent, passes through the pinhole 149 but the other beams of light that are not in-focus on the surface 131 of the substrate 130 are not also in-focus on the pinhole 149 and only a small fraction, e.g., less than 30 percent, of the other beams of light pass through the pinhole 149. Thus, the optical controller 118 may adjust a distance 117 between the pinhole structure 124 and the optical device 114 such that the reflected light from the surface of the substrate 130 is imaged on the pinhole structure 124. In some embodiments, the optical controller 118 moves the pinhole structure 124 and/or the optical device 114 to adjust the distance 117. In some embodiments, the optical device 114 is designed such that the reflected light from the beam of light that is focused on the surface of the substrate is focused on the pinhole 149. The reflected light from the other beams of light that are not focused on the surface of the substrate do not focus on the pinhole 149.

In some embodiments, the beam of light 142 has a wavelength w1, the beam of light 144 has a wavelength w2 (e.g., w2 greater than w1), and the beam of light 146 has a wavelength w3 (e.g., w3 greater than w2). In some embodiments, the stage controller 110 generates the location 158 of the surface 131 of the substrate 130 that is illuminated by the beams of light 142, 144, and 146. Thus, the location 158 of the surface 131 is a location that one the beams of light 142, 144, or 146 is in-focus. In some embodiments, either the stage controller 110 moves the stage 112 up or down, or the optical controller 118 moves the optical device 114 up or down to adjust a distance 136 between the optical device 114 and the substrate 130 such that a beam of light with a specific wavelength focuses on the surface 131 of the substrate 130. In some embodiments, the beam of light 134 is a beam of light that includes a continuous spectrum of wavelengths and thus the wavelength w1, w2, and w3 are examples of wavelengths in the beam of light 134. In some embodiments, the beam of light 134 is a white beam of light that includes a continuous spectrum of wavelengths from red to green and thus the wavelength w1, w2, and w3 are examples of wavelengths such as violet, green, or red. In some embodiments, the surface 131 of the substrate 130 is a backside surface of the substrate 130.

As shown in FIG. 1A, the beam of light 144 is in-focus on the bump 132 and the reflected light from the bump 132 is also focused at the pinhole 149 of the pinhole structure 124 and thus entirely, e.g., more than 90 percent, passes through the pinhole 149. The reflected light from the other beams of light 142 and 146 that are not in-focus on the surface of the substrate 130 are not also focused at the pinhole structure 124. Thus, only a fraction, e.g., a small fraction less than 30 percent, of the reflected light from the other beams of light 142 and 146 pass through the pinhole 149.

As noted, in some embodiments, the light source 116 is a white light source that includes wavelengths of the white light spectrum from red to violet. In some embodiments, the beams of light 142, 144, or 146 having the longer wavelength focuses farther from the optical device 114 and the beams of light 142, 144, or 146 having the shorter wavelength focuses closer to the optical device 114. Thus, when the light source 116 is a white light source, the violet beam of light 142 having the wavelength w1 focuses above the surface 131 of the substrate 130 and the red beam of light 146 having the wavelength w3 may focus farther inside the substrate 130 after, e.g., under, the surface 131 and the green beam of light 144 having the wavelength w2 focuses slightly above the surface 131 of the substrate 130, e.g., about 10 micron above the surface 131 between where the violet beam of light 142 and the red beam of light 146 focus. In some embodiments, the light source 116 includes a continuous spectrum of color sources, e.g., between red and violet, which produce the white light.

In some embodiments, the beams of light that passes through the pinhole 149 is imaged with a lens 122 on one or more light detectors 121 of a spectrometer 120. As shown in FIG. 1A, the reflected light that is focused on the pinhole structure 124 entirely passes through the pinhole 149 and thus produces a peak intensity in the light detectors 121. As shown, the beam of light 144 (having the wavelength w2) that focuses on the bump 132 of the substrate also focuses at the pinhole 149 and creates the peak intensity in the spectrometer. In some embodiments, the light source 116 includes multiple wavelengths and each light detector 121 of the spectrometer 120, detects the received light intensity in a specific wavelength, e.g., a specific short range of wavelengths. Thus each one of the light detectors 121 detects one of the wavelengths of the multiple wavelengths and thus creates an intensity 141 versus wavelength 143 curve, a spectrum 148 of the detected light on a display screen 140. In some embodiments, the spectrometer 120 includes a prism (not shown) for splitting the direction of transmission of the multiple wavelengths and thus leading each wavelength, e.g., a short wavelength range, to one of the light detectors 121. As shown in FIG. 1A, the spectrometer 120 generates a spectrum data 152, which includes intensity 141 per wavelength 143 of the received beams of light by the lens 122 and detected by the light detectors 121. In some embodiments, a display controller 115 receives the spectrum data 152 and displays the spectrum data 152 on the display screen 140.

In some embodiments, a peak-wavelength detector 125 determines, e.g., calculates or detects, the peak intensity of the spectrum 148 and determines a wavelength 154 corresponding to the peak intensity. As noted each wavelength of the multiple wavelengths of the beam of light 134 converges at a specific distance from the optical device 114. Thus, in some embodiments, a height variation of the substrate, e.g., a height 145 of the bump 132 on the substrate 130 is determined based on the wavelength of the light that converged, e.g., focused, on the bump 132 and thus produced the peak intensity in the spectrum data 152. In some embodiments, a wavelength-to-height converter 126 receives the wavelength 154 corresponding to the peak intensity and generates a height 156. For example, if the peak intensity is at w2 wavelength (e.g., in the green color range), the defect is a bump with a height 156 of about 10 microns and if the peak intensity is at w3 wavelength (e.g., in the red color range), the defect is a dip with a height 156 of −5 microns (e.g., a depth of about 5 microns).

As shown in FIG. 1A, the beam of light 144 that has the wavelength w2 focuses on the substrate 130, e.g., on the bump 132 of the substrate 130. In addition, the deflected beam of light 144 impinging on the pinhole structure 124 also focuses on the pinhole structure 124 and thus entirely passes through the pinhole 149 and thus produces a peak intensity in the light detectors 121. Also, the spectrum 148 produces a peak at the wavelength w2 of the beam of light 144.

In some embodiments, the multi-wavelength of the light source 116 includes one or more wavelength corresponding to desired heights and depths of the defects. In some embodiments, the reflected light that goes through the pinhole 149 is filtered by the spectrometer to select one or more wavelengths corresponding to defects having one or more desired height or depth.

The optical scanning system 180 of FIG. 1B is consistent with the optical scanning system of FIG. 1A with the difference that the spectrometer 120 of the optical scanning system 180 in addition to the light detectors 121 includes the peak-wavelength detector 125 and wavelength-to-height converter 126. Also, the optical scanning system 180 includes an optical system 185. In some embodiments, the optical system 185 includes the optical device 114 of FIG. 1A and transmits the beams of light 142, 144, and 146 to the surface of the substrate 130.

In addition, the optical system 185 receives the light reflected from the beams of light 142, 144, and 146 from the surface of the substrate 130 and directs the reflected light from the beam of light that is focused on the surface of the substrate out of an exit pupil 187 of the optical system 185. In some embodiments, the optical system 185 includes the pinhole 149. The optical system 185 is designed such that the reflected light from the beam of light that is focused on the surface of the substrate is focused on the pinhole 149 and thus transmits the light through the pinhole. However, the reflected light from the other beams of light that are not focused on the surface of the substrate do not focus on the pinhole 149 and only a fraction of them transmits through the pinhole 149. In some embodiments, the optical system 185 is designed such that the reflected light from the beam of light that is focused on the surface of the substrate transmits through the exit pupil 187 out of the optical system 185. The reflected light from the other beams of light that are not focused on the surface of the substrate are not transmitted through the exit pupil 187 out of the optical system 185. As shown in FIG. 1B, the beam of light 144 focuses on the surface of the substrate 130 and thus the reflected light from the beam of light 144 is transmitted through the exit pupil 187 out of the optical system 185.

Figure 2:
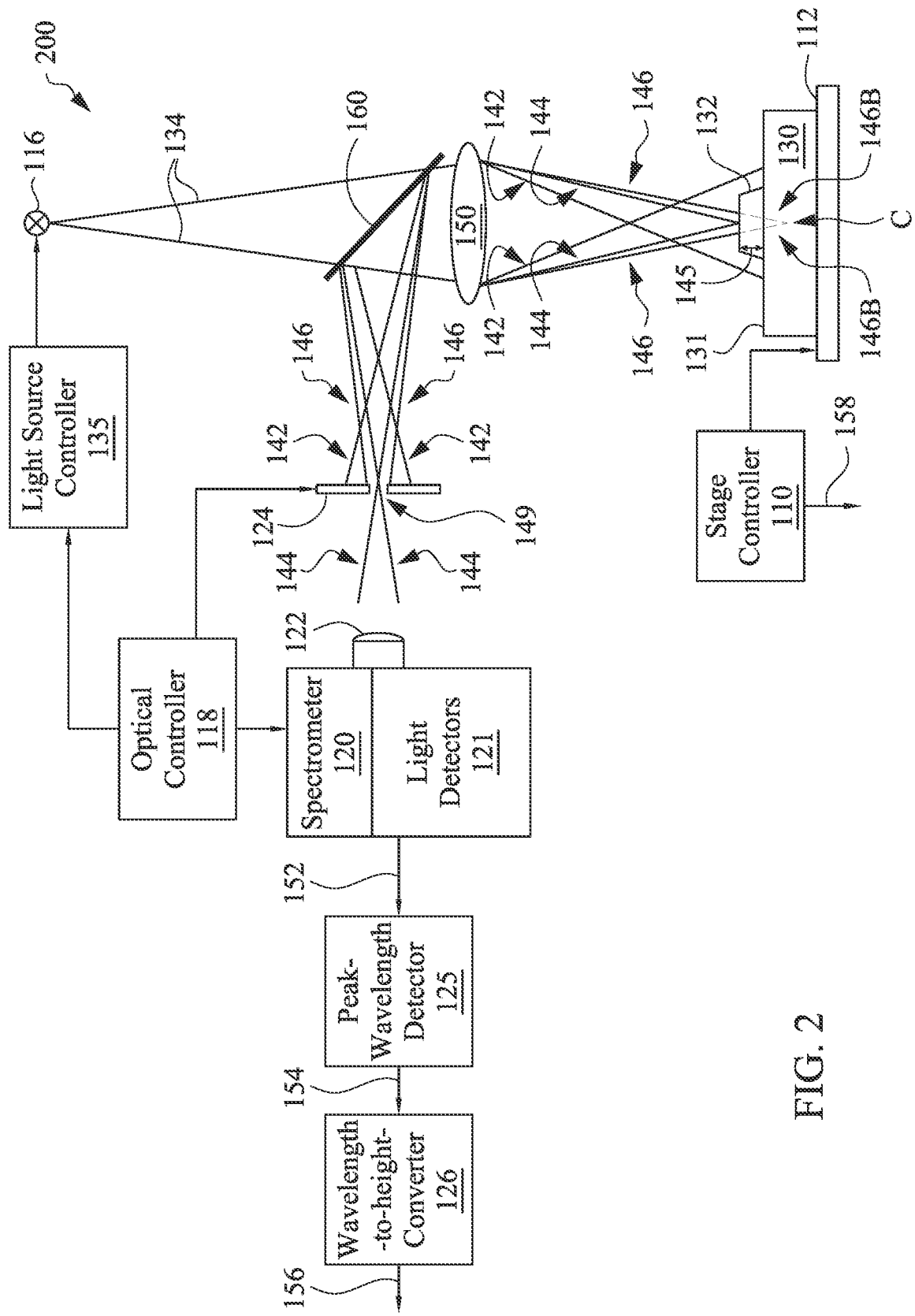
FIG. 2 illustrates an optical scanning system for scanning a substrate in accordance with some embodiments of the present disclosure.

FIG. 2 illustrates an optical scanning system 200 for scanning a substrate in accordance with some embodiments of the present disclosure. FIG. 2, is consistent with FIG. 1A. The optical scanning system 200 shows that the optical device 114 includes a chromatic lens 150 that creates the beams of light 142, 144, and 146 from the multi-wavelength beam of light 134. FIG. 2 also shows that the optical device 114 includes a beam splitter 160. In some embodiments, a portion of the beam of light 134 passes through the beam splitter 160 and hits the chromatic lens 150 to create the beams of light 142, 144, and 146. The reflected light from the surface of the substrate is transmitted back through the chromatic lens 150 and is deflected by the beam splitter 160 to the pinhole structure 124. In some embodiments, the chromatic lens 150 and the beam splitter 160 are used to image an illuminated surface 131 of the substrate 130 onto the pinhole structure 124.

Figure 3:
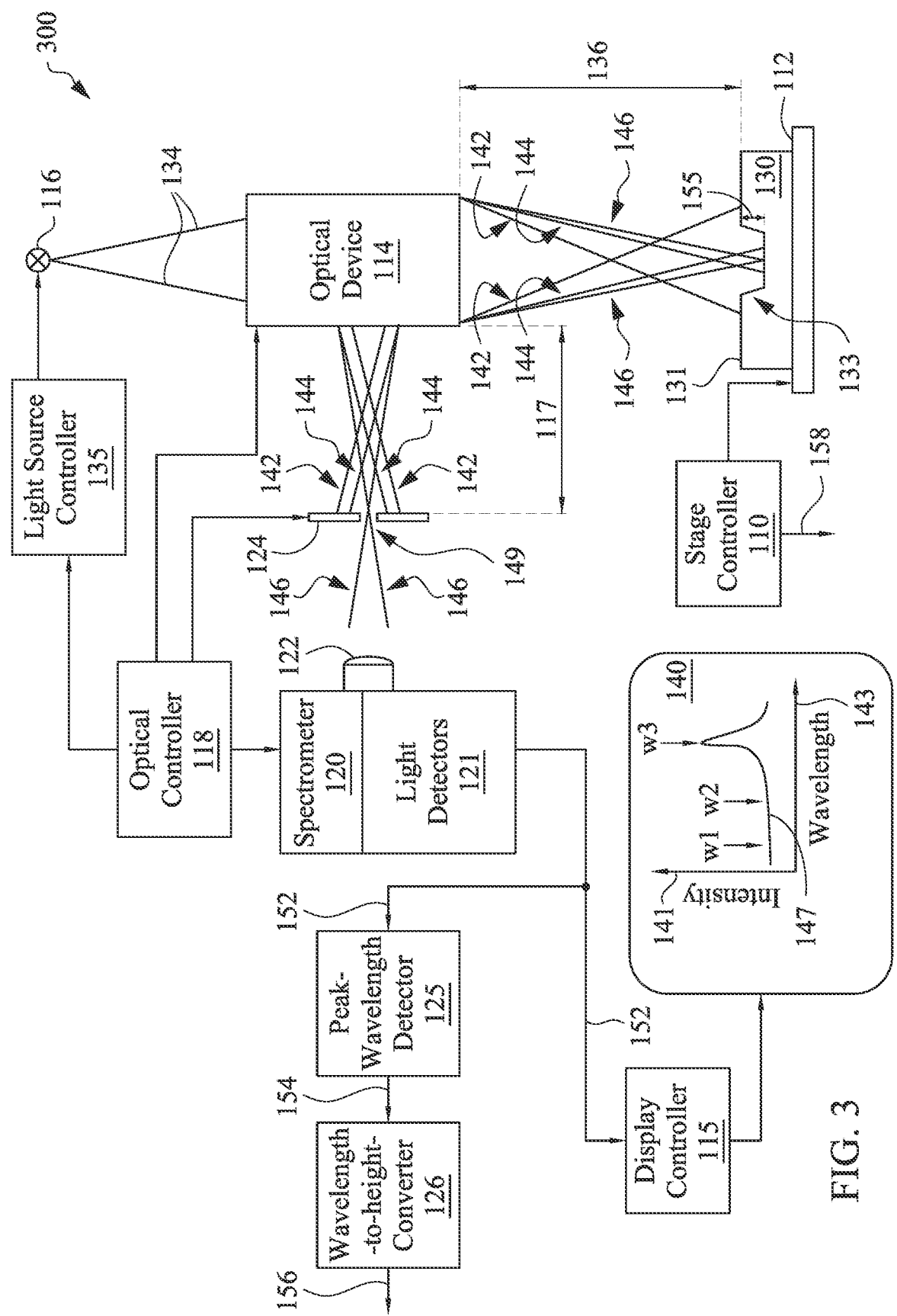
FIG. 3 illustrates an optical scanning system for scanning a substrate in accordance with some embodiments of the present disclosure.

FIG. 3 illustrates an optical scanning system 300 for scanning a substrate in accordance with some embodiments of the present disclosure. FIG. 3 is consistent with FIG. 1A. As shown in FIG. 3, the reflected light that is focused on the pinhole structure 124, e.g., the beam of light 146, entirely passes through the pinhole 149 and thus produces a peak intensity in the light detectors 121. As shown, the beam of light 146 (having the wavelength w3) that focuses at a bottom of a dip 133 on the substrate 130 also focuses at the pinhole 149 and creates the peak intensity of the spectrometer 120. In some embodiments as described, the light detectors 121 of the spectrometer 120 generate an intensity 141 versus wavelength 143, e.g., a spectrum 147 on a display screen 140. As shown in FIG. 3, the spectrometer 120 generates a spectrum data 152, which includes intensity 141 per wavelength 143 of the received beams of light by the lens 122 and detected by the light detectors 121.

As shown in FIG. 3, the beam of light 146 that has the wavelength w3 focuses on the substrate 130, e.g., at the bottom of the dip 133 of the substrate 130. In addition, the deflected beam of light 146 impinging on the pinhole structure 124 also focuses on the pinhole structure 124 and entirely passes through the pinhole 149 and thus produces a peak intensity in the light detectors 121. Also, the spectrum 147 produces a peak at the wavelength w3 of the beam of light 146.

As shown in FIG. 3, the reflected light from the surface 131 of the substrate 130 is received by the optical device 114 and is deflected by the optical device 114 to the pinhole structure 124. As shown the beam of lights 142 and 144, having the wavelengths w1 and w2, e.g., violet and green lights, do not focus on the surface 131 of the substrate 130. The beam of light 146, having the wavelength w3, e.g., the red light, focuses on a bottom surface of the dip 133 in the substrate 130. Thus, the reflected light from the red beam of light also focuses at the pinhole 149 and entirely passes through the pinhole 149. Thus, the intensity versus wavelength, e.g., the spectrum 147, has a peak in the red region. In some embodiments the wavelength of the peak intensity in the red region determines that a depth 155 of the dip 133 is about 5 microns.

Figure 4A:
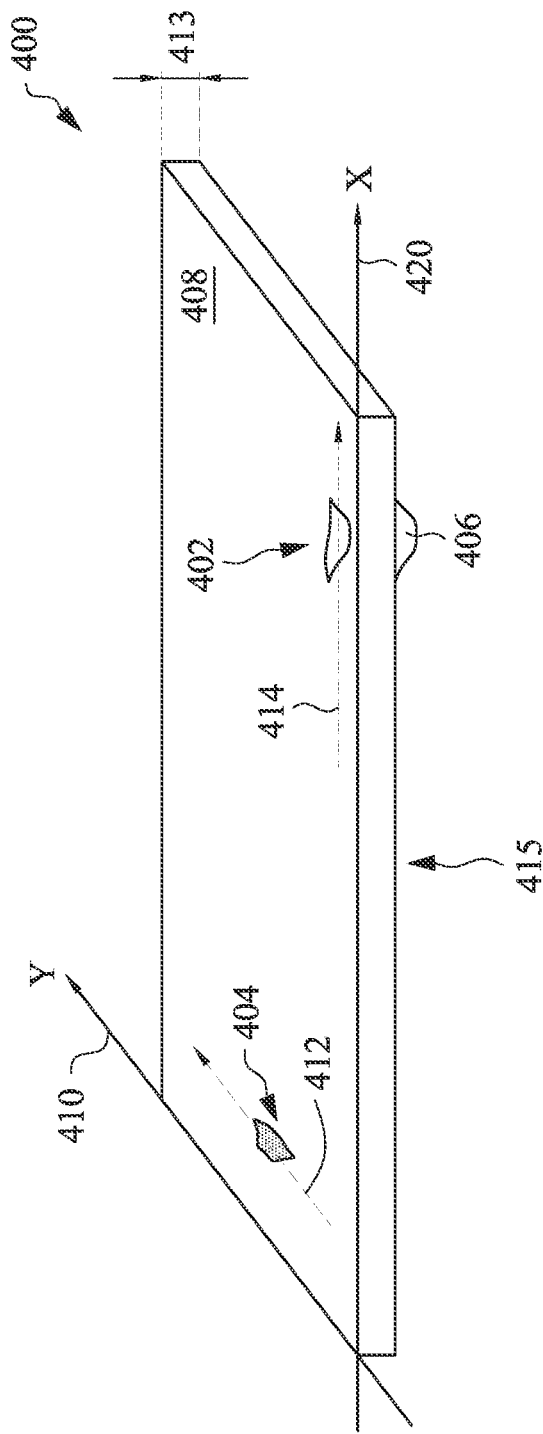
FIGS. 4A and 4B illustrate substrates that include scratches in accordance with some embodiments of the present disclosure.
Figure 4B:
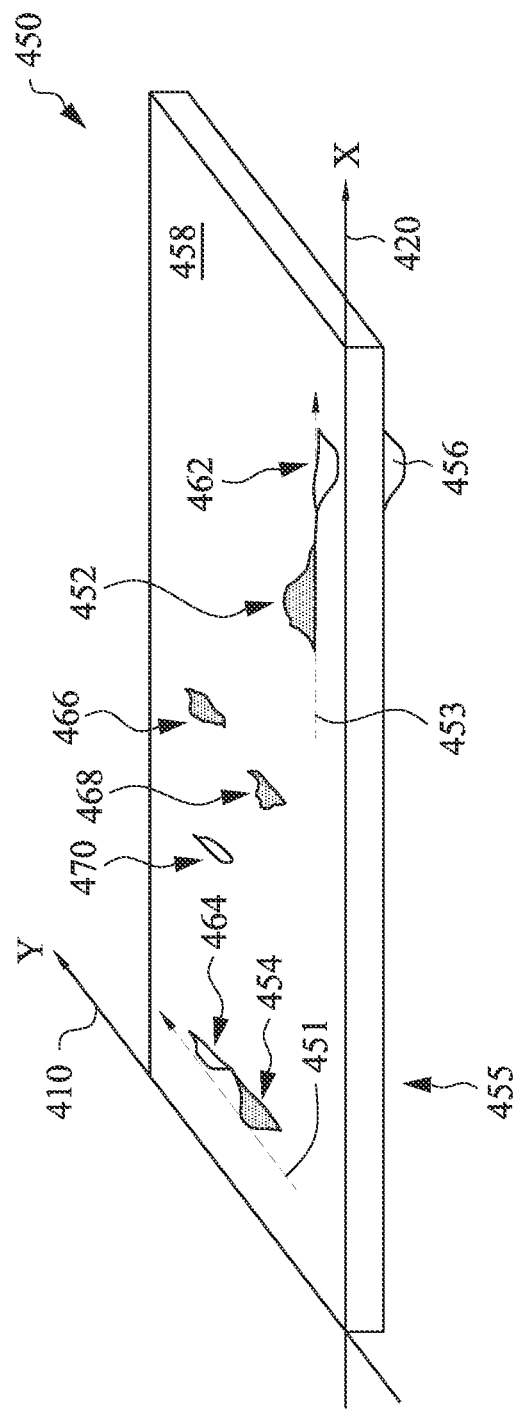

FIGS. 4A and 4B illustrate substrates that include scratches in accordance with some embodiments of the present disclosure. FIG. 4A shows a backside 408 of a substrate 400 with scratches and particles that includes a bump 404 and a dip 402. In some embodiments, the bump 404 on the backside 408 of the substrate is caused by or may cause a dip (not shown) on the front side 415 of the substrate. In some embodiments, the dip 402 on the backside 408 of the substrate is caused by or may cause a bump 406 on the front side 415 of the substrate. In some embodiments, the backside 408 of a substrate 400 is scanned by the optical scanning systems 100, 200, or 300 of FIGS. 1-3. In some embodiments, the bump 404 is scanned along a direction 412 that is parallel to a Y-direction 410 and the dip 402 is scanned along a direction 414 that is parallel to an X-direction 420. In some embodiments, a scratch on the backside 408 of the substrate 400, e.g., the dip 402 or the bump 404, does not have an associated scratch on the front side 415 of the substrate 400, however, the scratch on the backside 408 of the substrate 400 may cause a defect or wafer printing error in the thickness 413 of the substrate 400. Thus, the backside 408 and the front side 415 of the substrate 400 is scanned in some embodiments. In some embodiments, an edge region is a region extending 10 percent of the width of the substrate 400 in the X-direction and extending 10 percent of the length of the substrate 400 in the Y-direction. The substrate 400 is more vulnerable to having the scratches in the edge region and the bump 404 and the dip 402 may be in the edge region of the substrate 400. In some embodiments, the bump has a height of about 5 microns to about 15 microns, e.g., 10 microns.

FIG. 4B shows a backside surface 458 of a substrate 450 with scratches that includes bumps 452, 454, 466, 468; and dips 462, 464, and 470. As shown, the dip 462 on the backside surface 458 of the substrate 450 is caused by or may cause a bump 456 on the front side 455 of the substrate 450. In some embodiments, the backside surface 458 of a substrate 450 is scanned by the optical scanning systems 100, 200, or 300 of FIGS. 1-3. In some embodiments, the dip 464 follows the bump 454 in a direction 451 that is parallel to the Y-direction 410 and the dip 462 follows the bump 452 in a direction 453 that is parallel to the X-direction 420. In some embodiments, the bump 454 and the dip 464 are scanned along the direction 451 and the bump 452 and the dip 462 are scanned along the direction 453. In some embodiments, an entire backside of the substrate 450 including the bumps 452, 454, 466, 468 and the dips 462, 464, and 470 are scanned either along multiple parallel lines parallel to the Y-direction, along multiple parallel lines parallel to the X-direction, or both. In some embodiments, the edge region of the backside of the substrate 450 is scanned.

Figure 5:
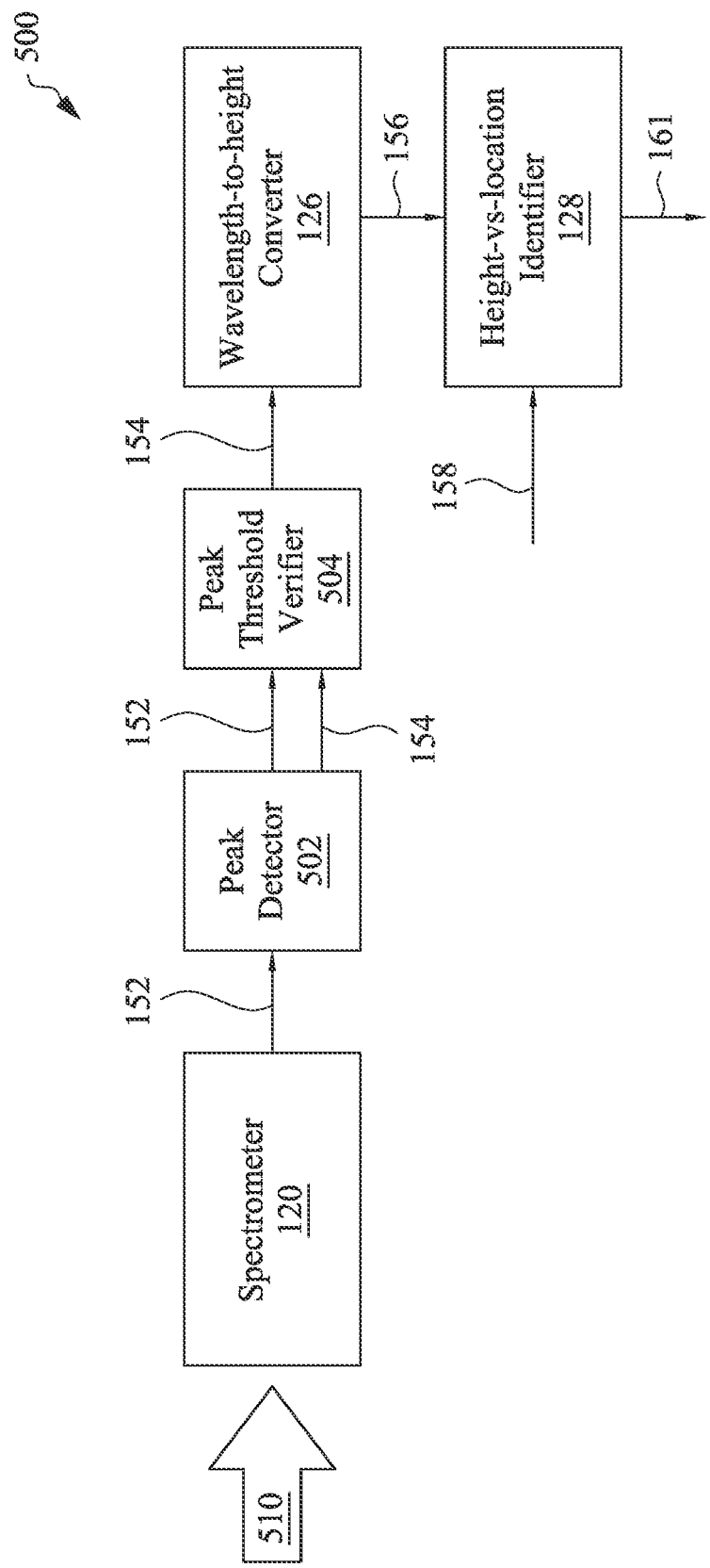
FIG. 5 illustrates a detector system for the optical scanning system in accordance with some embodiments of the present disclosure.

FIG. 5 illustrates a detector systems for the optical scanning system in accordance with some embodiments of the present disclosure. FIG. 5 shows the detector system 500 that includes the spectrometer 120, which receives the beams of light 510 through the lens 122. As described, the spectrometer 120 includes a prism for splitting the direction of transmission of the multiple wavelengths and thus directing each wavelength, e.g., a short wavelength range, to one of the light detectors 121 of the spectrometer 120. In some embodiments, each light detector 121 of the spectrometer 120 includes a filter for selecting a specific wavelength, a specific short wavelength range, of the beam of light 510. The output of the spectrometer 120 is the spectrum data 152, which includes intensity 141 per wavelength 143 of the received beams of light 510. The detector system 500 also includes a peak detector 502, consistent with the peak-wavelength detector 125 of FIGS. 1A, 1B, 2, and 3, that receives the spectrum data 152 and generates a peak wavelength 154 of the spectrum data 152 corresponding to the peak intensity of the spectrum data 152. Thus, the peak intensity of the spectrum data 152 is at the peak wavelength 154.

The detector system 500 also includes a peak threshold verifier 504 that receives the spectrum data 152 and the peak wavelength 154 having the peak intensity. The peak threshold verifier 504 may further determine an average value of the spectrum data and a shape of the spectrum data 152 around the peak intensity. The peak threshold verifier 504 verifies the peak intensity at the peak wavelength 154. In some embodiments, the peak intensity at the peak wavelength 154 in addition to being the peak value of the spectrum data 152, is at least two times greater than the average value of the spectrum data 152. In some embodiments, the shape of the spectrum data 152 around the peak intensity is a bump protruding outward and the peak threshold verifier 504 verifies that bump has a width within a threshold range. After verifying the peak wavelength 154, the peak wavelength 154 is inputted to the wavelength-to-height converter 126. In some embodiments, the wavelength-to-height converter 126 determines the associated height 156 of the surface 131 of the substrate 130 based on the peak wavelength 154. In some embodiments, the peak-wavelength detector 125 of FIGS. 1A, 1B, 2, and 3, is consistent with the combination of the peak detector 502 and the peak threshold verifier 504.

As noted, based on the height of the substrate, a specific wavelength converges, e.g., focuses, on the surface 131 of the substrate 130. As described above and shown in FIG. 1A, the beam of light 144 having the wavelength w2 converges on the bump 132 when the stage 112 is at a location, e.g., position, that the bump 132 is illuminated by the optical device 114. As noted, when the wavelength w2 converges on the bump 132, the deflected beam of light 144 entirely passes through the pinhole 149 and thus the peak of the spectrum data 152 is at wavelength w2, which is the peak wavelength.

In addition, as described above and shown in FIG. 3, the beam of light 146 having the wavelength w3 converges at the bottom of the dip 133 when the stage 112 is at a location that the dip 133 is illuminated by the optical device 114. When the wavelength w3 converges at the bottom of the dip 133, the deflected beam of light 146 entirely passes through the pinhole 149 and thus the peak of the spectrum data 152 is at wavelength w3. Thus, based on the peak wavelength 154 the height 156 at the surface 131 of the substrate 130 is determined.

Thus, the height of the surface 131, e.g., the height 145 of the bump 132, is determined based on the wavelength w2 and the height of the surface 131, a depth at the bottom of the dip 133, is determined based on the wavelength w3. In some embodiments, the location of the stage 112 is provided by the stage controller 110. Thus, for each location of the stage 112, e.g., a corresponding location 158 of the surface 131 of the substrate 130, the height 156 at the surface 131 of the substrate 130 is determined by the wavelength-to-height converter 126. In some embodiments, a height-vs-location identifier 128 receives a location 158 of the surface 131 of the substrate 130 as well as the height 156 at the surface 131 of the substrate 130 for multiple points of the surface 131 of the substrate 130 and provides a line scan data 161, e.g., a map data, of the height of the surface 131 of the substrate 130.

Figure 6A:
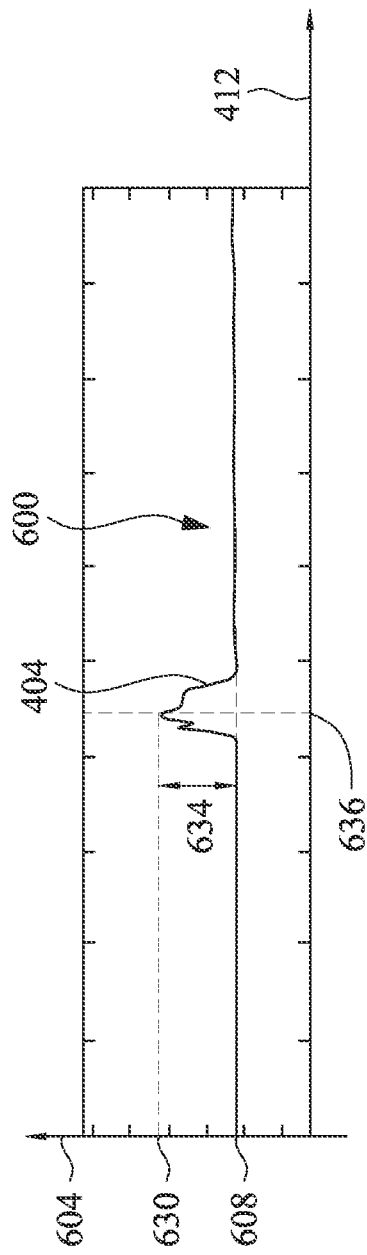
FIGS. 6A and 6B illustrate line scans through the substrates of FIG. 4A that include scratches and particle in accordance with some embodiments of the present disclosure.
Figure 6B:
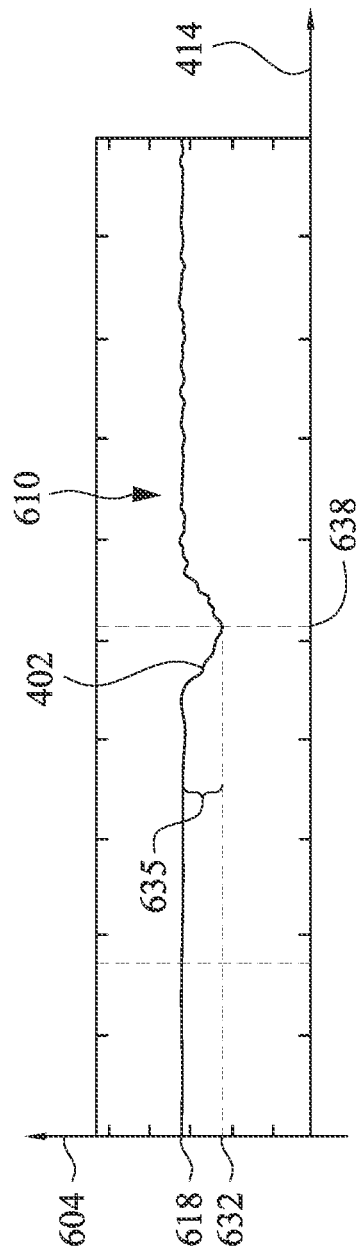

FIGS. 6A and 6B illustrate line scans through the substrates of FIG. 4A that include scratches and particle in accordance with some embodiments of the present disclosure. As shown in FIG. 6A, a graph 600, e.g., a profile, shows a line scan of the backside 408 of the substrate 400 having the bump 404 over the backside surface. In some embodiments, the horizontal coordinate is along the scanning direction 412 and is in millimeter and the vertical coordinate 604 is the height of the surface of the substrate 130 and is in microns. The backside surface of the substrate is displayed with an initial height 608. The bump 404 has a maximum height 630, where the maximum height is at location 636 on the horizontal coordinate that is along the direction 412 of FIG. 4A. The maximum height 630 is above the initial height 608 by a distance 634. In some embodiments, the distance 634 is between 2 microns and 15 microns, e.g., 10 microns. In some embodiments, the height 630 corresponds to wavelength w2.

As shown in FIG. 6B, a graph 610, e.g., a profile, shows a line scan of the backside 408 of the substrate 400 having the dip 402 over the backside surface. The backside surface of the substrate is displayed with an initial height 618. The dip 402 has a maximum depth 632, where the maximum depth 632 is at location 638 on the horizontal coordinate that is along the scanning direction 414 of FIG. 4A. The maximum depth 632 is below the initial height 618 by a distance 635. In some embodiments, the distance 635 is between 2 microns and 10 microns, e.g., 5 microns. In some embodiments, the graphs 600 and 610 are generated by the optical scanning system 100, 200, or 300 of FIGS. 1-3. In some embodiments, the depth 632 corresponds to wavelength w3.

Figure 7A:
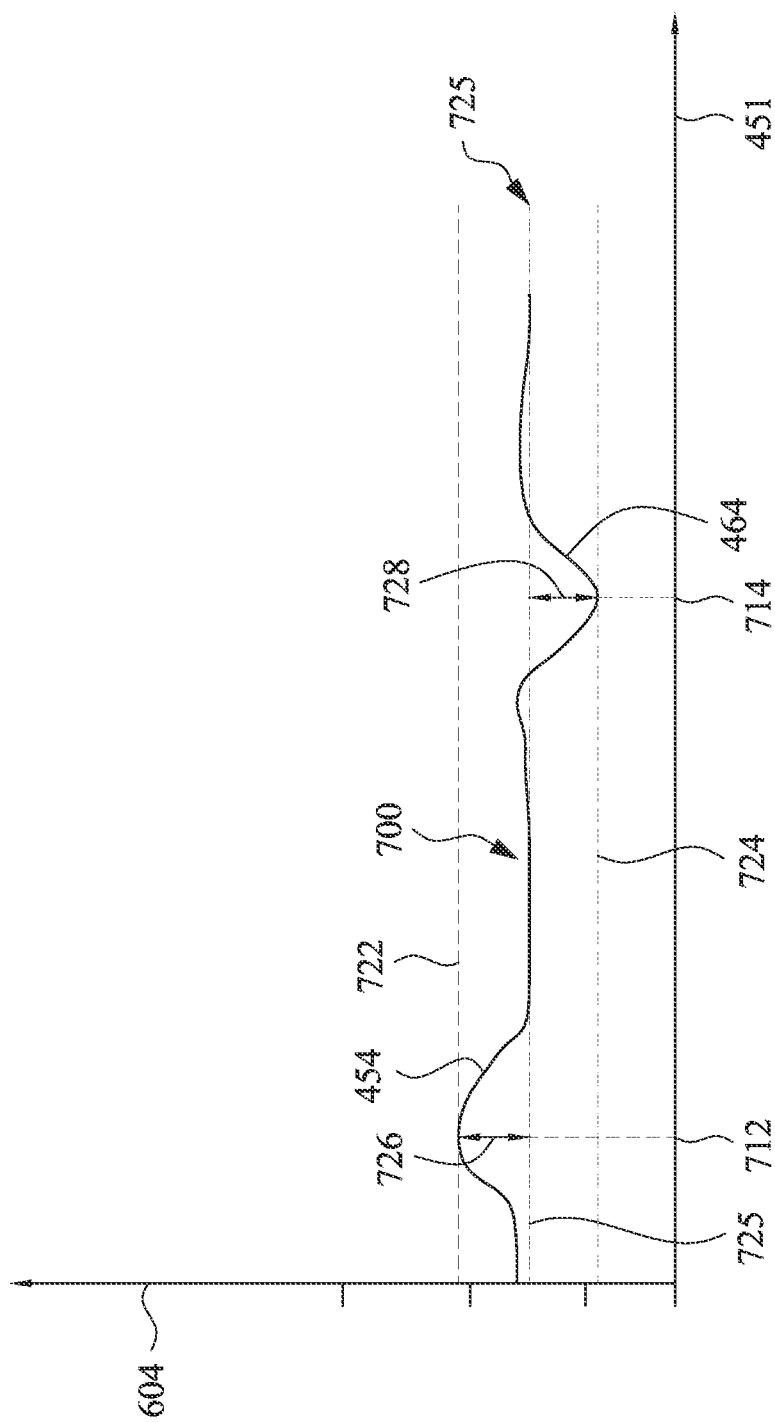
FIGS. 7A and 7B illustrate line scans through the substrates of FIG. 4B that include scratches and particles in accordance with some embodiments of the present disclosure.
Figure 7B:
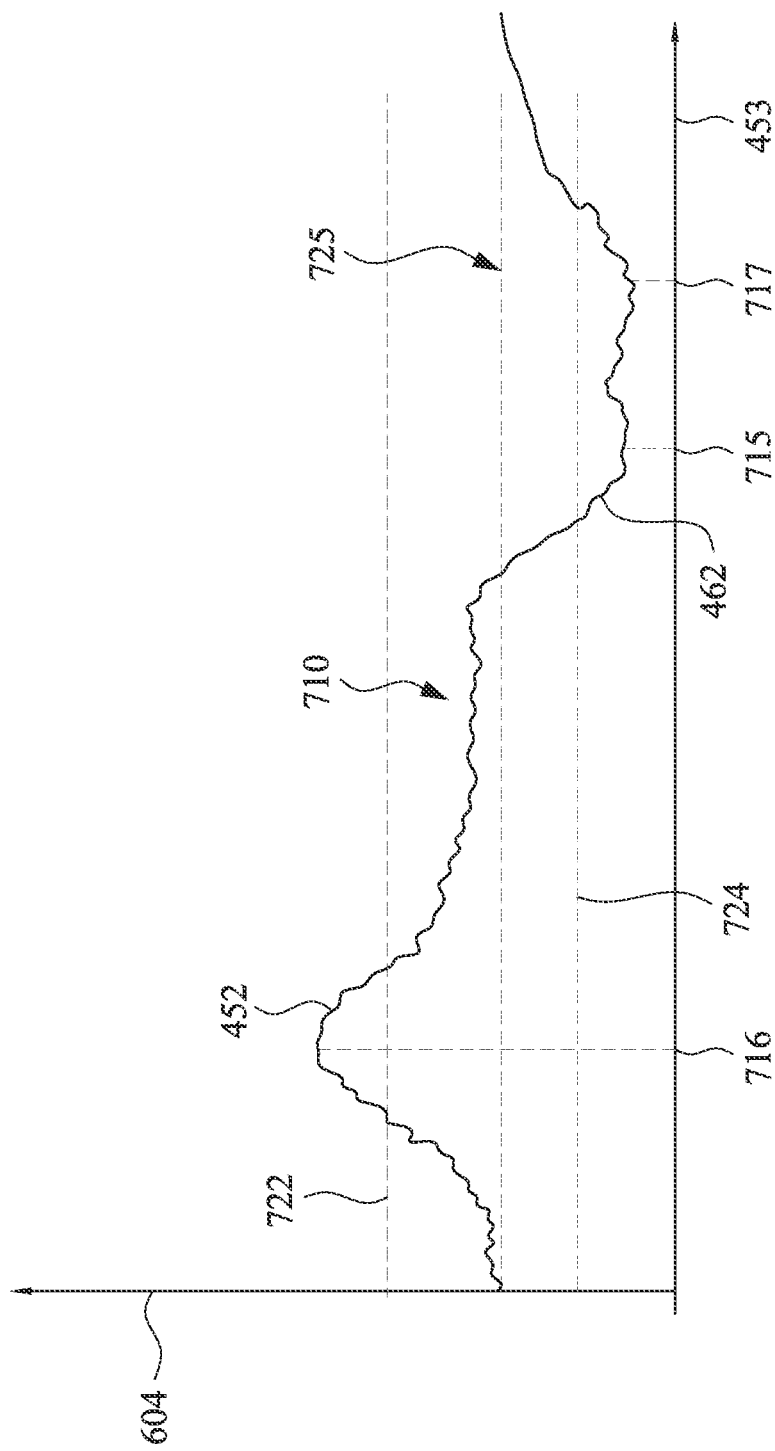

FIGS. 7A and 7B illustrate line scans through the substrates of FIG. 4B that include scratches and particle in accordance with some embodiments of the present disclosure. As shown in FIG. 7A, a graph 700, e.g., a profile, shows a line scan of the backside surface 458 of the substrate 450 having the bump 454 and the dip 464 over the backside surface 458. In some embodiments, the horizontal coordinate is along the scanning direction 451 and the vertical coordinate 604 is the height. The backside surface of the substrate is displayed with an initial height 725. The graph 700 shows that the backside scan has a bump around a distance 712 with a maximum height 722 at the distance 712. The graph 700 also shows that the backside scan has a dip around a distance 714 with a minimum height 724 at the distance 714. In some embodiments, the initial height 725 of the surface 131 of the substrate 130 corresponds to locations of the surface 131 of the substrate 130 which has no bumps or dips. In some embodiments, the maximum height 722 has a distance 726 above the initial height 725 and the minimum height 724 has a distance 728 below the initial height 725. In some embodiments, the maximum height 722 corresponds to the wavelength w2 and the minimum height 724 corresponds to the wavelength w3.

As shown in FIG. 7B, a graph 710, e.g., a profile, shows a line scan of the backside surface 458 of the substrate 450 having the bump 452 and the dip 462 over the backside surface 458. In some embodiments, the horizontal coordinate is along the scanning direction 453 and the vertical coordinate 604 is the height. The backside surface of the substrate is displayed with the initial height 725. The graph 710 shows that the backside scan has a bump around a distance 716 with a maximum height above the height 722 at the distance 716. The graph 710 also shows that the backside scan has two dips around distances 715 and 717 with two minimum depth below the height 724. In some embodiments, the initial height 725 of the surface 131 of the substrate 130 corresponds to locations of the surface 131 of the substrate 130 which has no bumps or dips. In some embodiments, the height 722 corresponds to the wavelength w2 and the height 724 corresponds to the wavelength w3. In some embodiments, the maximum of the bump 452 corresponds to the wavelength w1. In some embodiments the maximum height of the bump 452 is between 10 microns and 20 microns, e.g., 15 microns.

Figure 8:
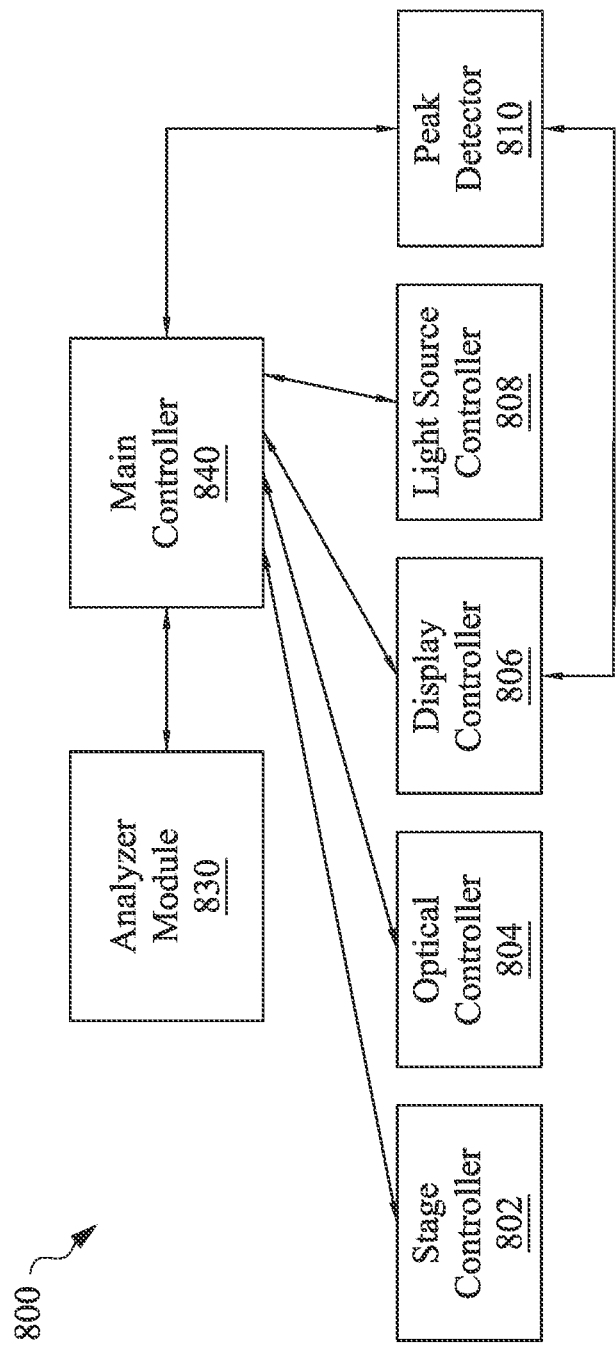
FIG. 8 illustrates an exemplary optical scanning system for scanning a substrate and determining scratches of a substrate in accordance with some embodiments of the disclosure.

FIG. 8 illustrates an exemplary optical scanning system 800 for determining scratches including bumps and/or dips of a substrate in accordance with some embodiments of the disclosure. The optical scanning system 800 includes an analyzer module 830 and a main controller 840 coupled to each other. Referring back to FIG. 1 or 3, the analyzer module 830 receives the wavelength 154 of the peak intensity of the spectrum data 152 of the reflected light from the surface of the substrate and determines, e.g., calculates, a height 156 of the surface of the substrate based on the received wavelength 154. The analyzer module 830 receives the wavelength 154 of the peak intensity from a peak detector 810, which is consistent with the peak-wavelength detector 125 of FIGS. 1A and 1s also consistent with a combination of the peak detector 502 and the peak threshold verifier 504. The peak detector 810 is either directly coupled to the analyzer module 830 or is coupled to the analyzer module 830 via the main controller 840.

In some embodiments, the analyzer module 830 is consistent with a combination of the peak-wavelength detector 125 and the wavelength-to-height converter 126 of FIGS. 1A, 1B, 2, and 3. As shown in FIG. 8, the main controller 840, controls the other controllers, devices, and systems. In some embodiments, a main controller (not shown), consistent with the main controller 840, controls the timing and functionality of the optical controller 118, light source controller 135, the spectrometer 120, the stage controller 110 and the display controller 115 of the optical scanning systems 100 and 300 of FIGS. 1A and 3. The main controller enables the optical scanning systems 100 or 300 to scan a surface of the substrate 130 and display a map of the specific range of heights on the surface of the substrate as shown in FIGS. 7A and 7B. In some embodiments, a main controller (not shown), consistent with the main controller 840, controls the timing and functionality of the optical controller 118, the spectrometer 120, the stage controller 110, the display controller 115, and the optical system 185 (via the optical controller 118) of the optical scanning system 180 of FIG. 1B.

In some embodiments, the main controller 840 is coupled to a light source controller 808, a display controller 806, an optical controller 804, and a stage controller 802. In some embodiments and returning back to FIG. 1A the optical controller 804 is consistent with the optical controller 118. The optical controller 804, which is controlled by the main controller 840, controls the optical device 114 to perform transmitting a converging beam of light to the surface of the substrate, receiving the reflected light from the surface of the substrate, and transmitting the reflected light from the surface of the substrate to the pinhole structure 124. In addition, the optical controller 804 may control a location of the pinhole structure 124 and a size of the pinhole 149 such that the beam of light having the wavelength that focuses on the surface of the substrate focuses at the pinhole structure 124 and passes, e.g., entirely passes, through the pinhole 149 and the other beams of light having other wavelengths do not pass through the pinhole 149 or a fraction passes through the pinhole 149. The optical controller 804 also controls the light source controller 808, which is consistent with the light source controller 135 of FIG. 1A, to control the light source 116 and to generate the beam of light 134 that includes a plurality of wavelengths to transmit the beam of light 134 to the optical device 114.

In some embodiments, the main controller 840 is coupled to and controls the stage controller 802, which is consistent with the stage controller 110 of FIG. 1A, to move the substrate such that the optical device 114 receives the reflected light from different points on the surface of the substrate. In some embodiments, the main controller 840 is coupled to and controls the display controller 806, which is consistent with the display controller 115 of FIG. 1A, to display a spectrum of the reflected beam of light from a location of the substrate on the display screen 140 or to display a scan line of the height of the surface of the substrate on the display screen 140.

Figure 9:
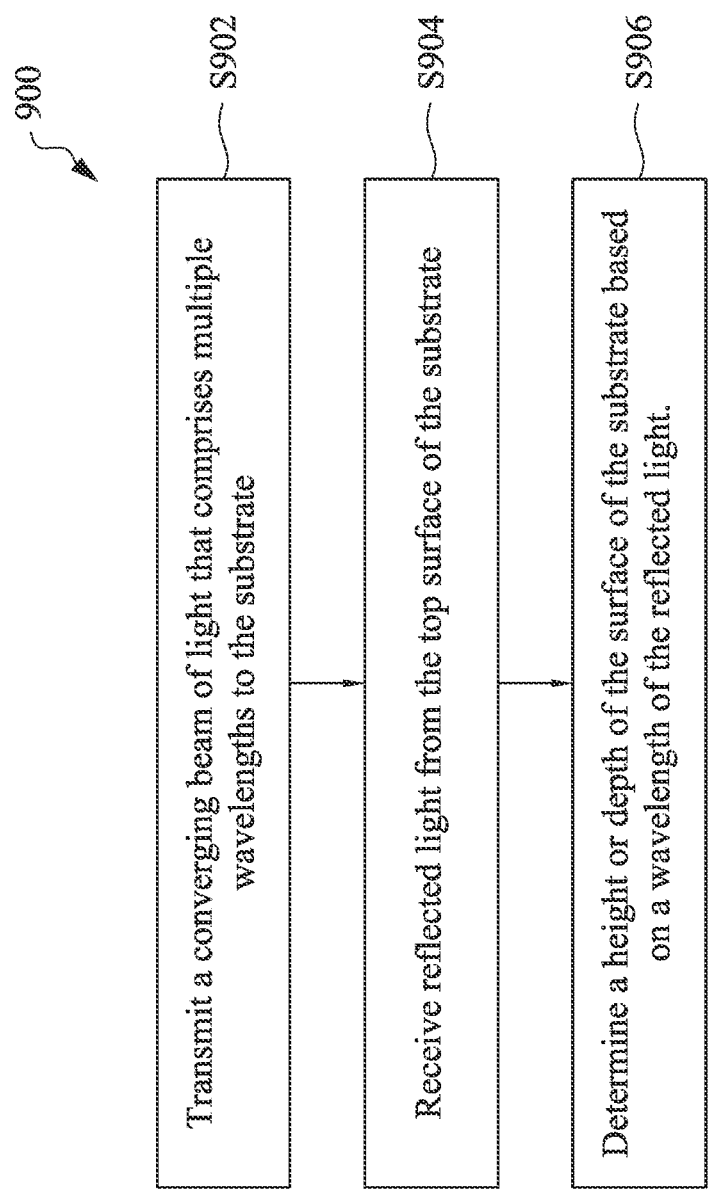
FIG. 9 illustrates a flow diagram of an exemplary process for scanning a substrate and determining scratches of the substrate in accordance with some embodiments of the disclosure.

FIG. 9 illustrates a flow diagram of an exemplary process for scanning a substrate and determining scratches including bumps and/or dips of the substrate in accordance with some embodiments of the disclosure. The process 900 may be performed by the optical scanning system of FIGS. 1, 2, 4, and 8. In some embodiments, the process 900 or a portion of the process 900 is performed and/or is controlled by the computer system 1000 described below with respect to FIGS. 10A and 10B. The method includes the operation S902 of transmitting a converging beam of light that comprises multiple wavelengths to a substrate. As shown in FIG. 1A, the beam of light 134 is transmitted by the light source 116 and the beam of light 134 is focused by the optical device 114. In operation S904, reflected light from the surface of the substrate is received. As shown in FIG. 1A, the reflected light is received by the spectrometer 120. In operation S906, a height or depth of the surface of the substrate is determined based on a wavelength of the reflected light. As discussed, the height or depth is determined based on the wavelength corresponding to the peak intensity of the detected light from the surface of the substrate. In some embodiments and referring back to FIG. 1A, the analyzer module 830 of FIG. 8 determines the wavelength of the peak intensity of the spectrum data 152 and also determines the height of the surface 131 of the substrate 130 based on the determined wavelength.

Figure 10B:
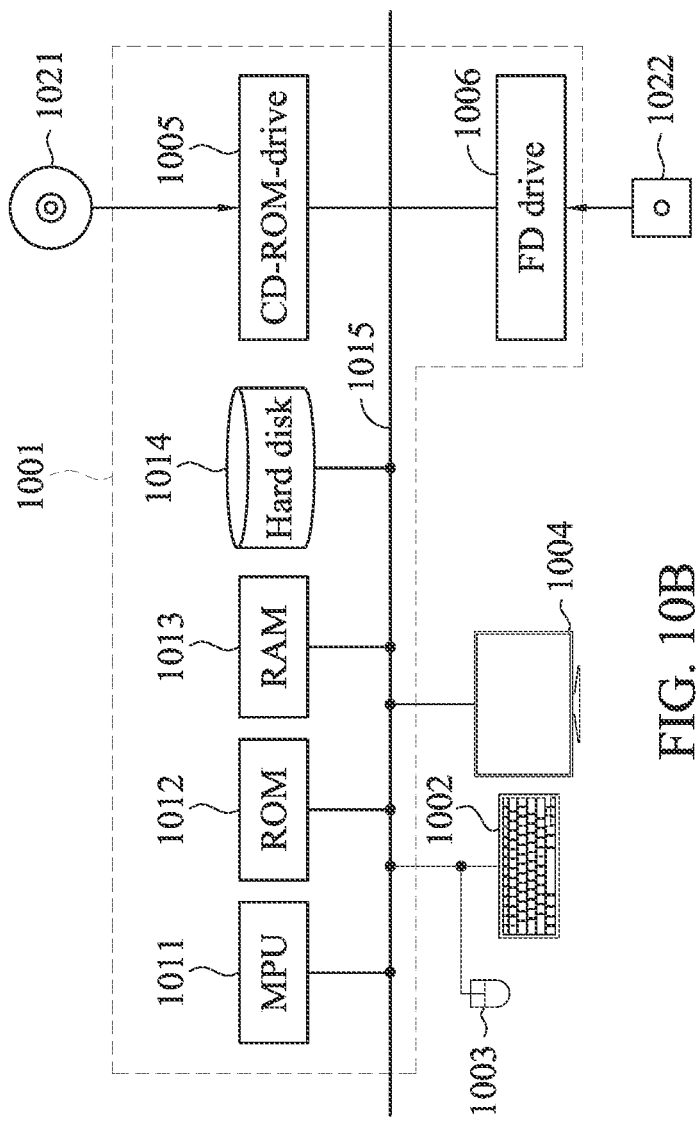
FIGS. 10A and 10B illustrate an apparatus for scanning a substrate and determining scratches of the substrate in accordance with some embodiments of the disclosure.
Figure 10A:
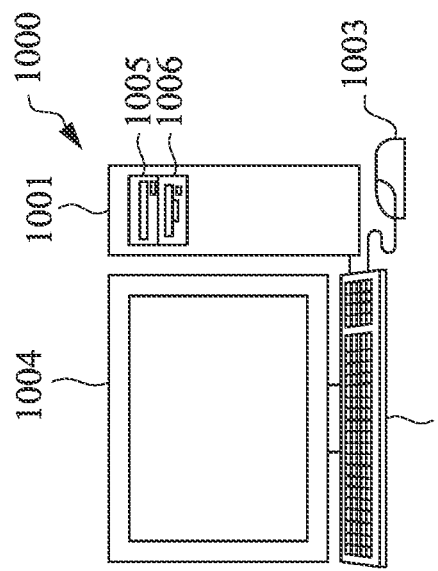

FIGS. 10A and 10B illustrate an apparatus for scanning a substrate and determining scratches including bumps and dips of the substrate in accordance with some embodiments of the disclosure. FIG. 10A is a schematic view of a computer system 1000 that executes the process for determining the bumps and dips of the substrate according to one or more embodiments as described above. All of or a part of the processes, method and/or operations of the foregoing embodiments can be realized using computer hardware and computer programs executed thereon. The operations include converging a multi-wavelength beam of light on a substrate for determining bumps and dips of the substrate. Thus, in some embodiments, the computer system 1000 provides the functionality of the optical controller 804, the analyzer module 830, the main controller 840, the stage controller 802, the light source controller 808, the peak detector 810, and the display controller 806. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004. In some embodiments, the computer system 1000 provides the functionality of the optical controller 118, the light source controller 135, the stage controller 110, and the display controller 115 of FIG. 1A. As described, in some embodiments, a main controller, consistent with the main controller 840, controls the timing and functionality the other controllers, devices, and systems of the optical scanning systems of FIGS. 1A, 1B, 2, and 3. Thus, the computer system 1000 also provides the functionality of the main controller.

FIG. 10B is a diagram showing an internal configuration of the computer system 1000. In FIG. 10B, the computer 1001 is provided with, in addition to the optical disk drive 1005 and the magnetic disk drive 1006, one or more processors 1011, such as a micro-processor unit (MPU), a ROM 1012 in which a program such as a boot up program is stored, a random access memory (RAM) 1013 that is connected to the processors 1011 and in which a command of an application program is temporarily stored and a temporary storage area is provided, a hard disk 1014 in which an application program, a system program, and data are stored, and a bus 1015 that connects the processors 1011, the ROM 1012, and the like. Note that the computer 1001 may include a network card (not shown) for providing a connection to a LAN.

The program for causing the computer system 1000 to execute the process for determining the scratches including bumps and/or dips of the substrate in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the process for manufacturing the lithographic mask of a semiconductor device in the foregoing embodiments. The program may only include a command portion to call an appropriate function (module) in a controlled mode and obtain desired results.

In some embodiments, implementing the processes and methods mentioned above, increases the throughput of scanning the backside of a substrate such a mask blank. In processes of manufacturing an integrated circuit or a die by EUV lithography process, a substrate, e.g., a mask blank, a backside of a mask or a patterned mask, is scanned for bumps and dips before the lithography process. When detecting a unwanted bump or dip on the mask and imaging a layout pattern on the mask blank by the present disclosure, the mask or region with bumps and dips can be effectively avoided or repaired for wafer printing error concerns. Accordingly, the mask used in the EUV lithography process is qualified by the system and method of the present disclosure.

It will be understood that not all advantages have been necessarily discussed herein, no particular advantage is required for all embodiments or examples, and other embodiments or examples may offer different advantages.

According to some embodiments of the present disclosure, a method of scanning a substrate includes transmitting a converging beam of light that comprises multiple wavelengths to the substrate. Each wavelength of the multiple wavelengths focuses at a different distance in a focus interval around and including a surface of the substrate. The method also includes receiving reflected light from the surface of the substrate and determining a height or depth of the surface of the substrate based on a wavelength of the reflected light having a highest intensity. In an embodiment, the method further includes irradiating the surface of the substrate with the converging beam of light from a light source located at a first distance from the surface of the substrate. The surface of the substrate is a backside surface of the substrate and the light source is located above the backside surface of the substrate. In an embodiment, the first distance is a perpendicular distance between the light source and a flat portion of the surface of the substrate with no bumps or dips. In an embodiment, the surface of the substrate includes one or more of bumps and dips, wherein a height of a bump or a depth of dip on the surface of the substrate is determined with respect an area having with no bumps or dips surrounding the bump or the dip. In an embodiment, the reflected light from the surface of the substrate is received by a spectrometer, the method further includes detecting the reflected light from a first point on the surface of the substrate, determining a spectrum of the detected reflected light, determining a first wavelength of a peak intensity of the spectrum, and determining the height or depth of the first point on the surface of the substrate based on the first wavelength of the peak intensity. In an embodiment, the spectrometer includes a lens at an input to the spectrometer. The lens focuses the reflected light from the surface of the substrate onto one or more light detectors and each light detector includes a filter to select a specific wavelength range to generate a signal proportional to an intensity of the reflected light in the specific wavelength range. In an embodiment, a portion of the converging beam of light having the first wavelength is configured to focuses on the surface of the substrate. In an embodiment, a pinhole structure having a pinhole is arranged before the lens of the spectrometer. The reflected light with the first wavelength focuses on the pinhole structure and the reflected light with the first wavelength substantially entirely passes through the pinhole. In an embodiment, the reflected light having one or more wavelengths other than the first wavelength does not focus on the pinhole. In an embodiment, a fraction of the reflected light passes through the pinhole when the reflected light has the other than the first wavelength. In an embodiment, the reflected light having a wavelength that does not focus on the surface of the substrate does not focus on the pinhole structure. In an embodiment, the substrate is arranged on a stage and the method further includes configuring the stage to move the substrate in a first direction and receiving the reflected light from the surface of the substrate at one or more different points along the first direction, scanning the surface of the substrate by the converging beam of light, receiving the reflected light from the surface of the substrate in a specific range of wavelengths corresponding to a specific range of heights, and determining a map of the specific range of heights on the surface of the substrate on a scan line along the first direction. In an embodiment, the method further includes moving the stage in parallel lines along the first direction or moving the stage in parallel lines perpendicular to the first direction to scan the substrate, receiving the reflected light from the surface of the substrate in a specific range of wavelength corresponding to a specific range of heights, and determining a map of the specific range of heights on the surface of the substrate. In an embodiment, the light source is a white light source and the multiple wavelengths are in white light spectrum.

According to some embodiments of the present disclosure, a method of scanning a substrate includes receiving reflected light from a first point on a surface of the substrate and configuring the reflected light to pass through a pinhole. The method includes detecting the reflected light from the first point after passing the pinhole and determining a spectrum of the detected reflected light. The method also includes determining a first wavelength of a peak intensity of the spectrum and determining a height or depth of the first point on the surface of the substrate based on the first wavelength of the peak intensity. In an embodiment, the substrate is arranged on a stage and the method further includes configuring the stage to move the substrate in a first direction and receiving the reflected light from the surface of the substrate at one or more different points along the first direction, scanning the surface of the substrate by a converging beam of light, receiving the reflected light from the surface of the substrate in a specific range of wavelength corresponding to a specific range of heights, and determining a map of the specific range of heights on the surface of the substrate on a scan line along the first direction.

According to some embodiments of the present disclosure, a system for scanning a substrate includes a main controller, a light source coupled to the main controller and to transmit a beam of light that includes multiple wavelengths to the substrate, and a stage coupled to the main controller and configured to move the substrate. The system also includes an optical system disposed in a light path between the light source and the substrate and coupled to the main controller and configured for focusing the beam of light on a surface of the substrate, and a spectrometer to receive the beam of light reflected from the surface of the substrate and directed by the optical system and configured for detecting reflected light from a first point on the surface of the substrate, determining a spectrum of the detected reflected light determining a first wavelength of a peak intensity of the spectrum, and determining a height or depth of the first point on the surface of the substrate based on the first wavelength of the peak intensity. In an embodiment, the spectrometer includes a lens for focusing the reflected light onto the one or more light detectors. Each light detector generates a signal proportional to the reflected light in a specific wavelength range. In an embodiment, the light source is a white light source and the multiple wavelengths are in white light spectrum. In an embodiment, the system further includes a pinhole disposed in a light path between the substrate and the spectrometer. The pinhole is arranged before the lens of the spectrometer, the reflected light with the first wavelength focuses on the pinhole and substantially entirely pass through the pinhole, and the reflected light having wavelengths other than the first wavelength does not focus on the pinhole and a fraction of the reflected light passes through the pinhole when the reflected light has other than the first wavelength.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of scanning a substrate, comprising:
    transmitting a converging beam of light that comprises multiple wavelengths to a back surface of the substrate, wherein each wavelength of the multiple wavelengths is configured to focus at a different distance in a focus interval around and including the back surface of the substrate;
    receiving reflected light bounced back from the back surface of the substrate;
    determining, based on a spectrum of the reflected light intensity versus wavelength, a first wavelength of the reflected light having a highest intensity, wherein the highest intensity is verified to be a peak intensity if the highest intensity is at least two times greater than an average intensity value of the spectrum, and wherein the converging beam with the first wavelength focuses at a first location; and
    determining a height or depth at the first location from the back surface of the substrate directly and only based on the first wavelength of the reflected light as a peak wavelength corresponding to the peak intensity.

2. The method of claim 1, further comprising: before transmitting the converging beam of light, placing the substrate on a stage such that a front surface faces the stage.

3. The method of claim 1, wherein the multiple wavelengths respectively focus at the first location on the back surface of the substrate and without entering the substrate and get reflected from the first location, focus above the first location and without entering the substrate and get reflected from the first location of the back surface of the substrate, and get reflected from the first location of the back surface of the substrate without being focused and without entering the substrate.

4. The method of claim 2, further comprising irradiating the back surface of the substrate with the converging beam of light from a light source located at a first distance from the back surface of the substrate, wherein a beam splitter is disposed between the light source and the stage such that the beam of light from the light source passes through the beam splitter.

5. The method of claim 4, wherein the first distance is a perpendicular distance between the light source and a flat portion of the back surface of the substrate with no bumps or dips.

6. The method of claim 4, wherein the reflected light bounced back from the back surface of the substrate is received by a spectrometer.

7. The method of claim 6, further comprises:
detecting the reflected light bounced back from the first location by the spectrometer;
determining the spectrum of the detected bounced back reflected light by the spectrometer;
determining the first wavelength as a wavelength at the peak intensity of the spectrum; and
determining the height or depth of the first location based on the first wavelength of the peak intensity of the spectrum.

8. The method of claim 6, wherein the spectrometer comprises a lens at an input to the spectrometer, the lens is configured to focus the reflected light bounced back from the back surface of the substrate onto one or more light detectors, and wherein each light detector comprises a filter to select a specific wavelength range and to generate a signal proportional to an intensity of the reflected light in the specific wavelength range.

9. The method of claim 8, wherein a pinhole structure having a pinhole is arranged before the lens of the spectrometer, wherein the reflected light is deflected by the beam splitter at about 90 degrees and is directed to the pinhole structure.

10. The method of claim 9, wherein the reflected light with the first wavelength is configured to focus at the pinhole and substantially entirely passes through the pinhole, and wherein the reflected light having one or more wavelengths other than the first wavelength is configured not to focus on the pinhole.

11. A method of scanning a substrate, comprising:
receiving reflected light bounced back based on an incident light directed at a first location of a surface of the substrate, the first location including a defect;
determining a spectrum of the detected reflected light intensity versus wavelength;
determining a first wavelength of a peak intensity of the spectrum, wherein a highest intensity of the spectrum is verified to be the peak intensity if the highest intensity is at least two times greater than an average intensity value of the spectrum, and wherein the incident light with the first wavelength focuses at the first location; and
determining a height or a depth of the defect measured from an open surface of the substrate directly and only based on the first wavelength as a peak wavelength corresponding to the peak intensity.

12. The method of claim 11, further comprising:
configuring the reflected light to pass through a pinhole; and
detecting the reflected light bounced back from the first location after passing through the pinhole.

13. The method of claim 11, wherein the substrate is arranged on a stage, the method further comprising:
configuring the stage to move the substrate in a first direction and receiving the reflected light bounced back from the open surface of the substrate at one or more different locations along the first direction;
scanning the open surface of the substrate by a converging beam of light;
receiving the reflected light bounced back from the open surface of the substrate in a specific range of wavelengths corresponding to a specific range of heights and depths on the open surface of the substrate; and
determining a map of the specific range of heights and depths on the open surface of the substrate on a scan line along the first direction.

14. The method of claim 11, wherein the defect comprises one or more of bumps and dips, wherein a height of a bump and a depth of a dip measured from the open surface of the substrate is determined with respect an area having with no bumps or dips surrounding the bump or the dip.

15. The method of claim 11, wherein the reflected light comprises multiple wavelengths in white light spectrum, the method further comprising:
deflecting the reflected light at about 90 degrees to be directed at the pinhole, wherein a portion of the reflected light with the first wavelength focuses at the pinhole and substantially entirely passes through the pinhole.

16. The method of claim 11, wherein the incident light is bounced back by roughness at the first location without entering the substrate.

17. A system for scanning a substrate, comprising:
an optical system disposed in a light path between a light source and the substrate and coupled to a main controller and configured for focusing a beam of light transmitted from the light source on an open surface of the substrate; and
a spectrometer to receive a reflected beam of light bounced back by roughness on the open surface of the substrate, wherein the reflected beam of light is directed by the optical system to the spectrometer, the spectrometer is configured for:
detecting reflected light bounced back from a first location including a defect on the open surface of the substrate;
determining a spectrum of the detected reflected light intensity versus wavelength;
determining a first wavelength of a peak intensity of the spectrum, wherein the peak intensity of the spectrum is defined to be at least two times greater than an average intensity value of the spectrum; and
determining a height or a depth of the defect measured from the open surface of the substrate directly and only based on the first wavelength as a peak wavelength corresponding to the peak intensity.

18. The system of claim 17, wherein the light source is a white light source and the multiple wavelengths are in white light spectrum.

19. The system of claim 17, wherein the spectrometer includes a lens configured for focusing the reflected light onto one or more light detectors of the spectrometer, and wherein each light detector is configured to generate a signal proportional to the reflected light in a specific wavelength range.

20. The system of claim 19, further comprising a pinhole disposed in a light path between the substrate and the spectrometer, wherein the pinhole is arranged before the lens of the spectrometer, wherein the reflected light is deflected at about 90 degrees to be directed to the spectrometer and the reflected light having the first wavelength is configured to focus on the pinhole and substantially entirely pass through the pinhole to reach a first light detector, and wherein the reflected light having wavelengths other than the first wavelength is configured to not focus on the pinhole and a fraction of the reflected light having the wavelengths other than the first wavelength is configured to pass through the pinhole to reach the first light detector.

* * * * *